US012653063B2

(12) United States Patent
Kabir et al.

(10) Patent No.: US 12,653,063 B2
(45) Date of Patent: Jun. 9, 2026

(54) HERMETIC SEAL FOR TRANSISTORS WITH METAL ON BOTH SIDES

(71) Applicant: Intel Corporation, Santa Clara, CA (US)

(72) Inventors: Mohammad Enamul Kabir, Portland, OR (US); Conor P. Puls, Portland, OR (US); Tofizur Rahman, Portland, OR (US); Keith Zawadzki, Portland, OR (US); Hannes Greve, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 407 days.

(21) Appl. No.: 17/555,654

(22) Filed: Dec. 20, 2021

(65) Prior Publication Data

US 2023/0197538 A1 Jun. 22, 2023

(51) Int. Cl.
*H01L 23/04* (2006.01)
*H10D 84/83* (2025.01)
(Continued)

(52) U.S. Cl.
CPC ............ *H10W 76/12* (2026.01); *H10D 84/83* (2025.01); *H10W 42/00* (2026.01); *H10W 70/611* (2026.01); *H10W 70/635* (2026.01)

(58) Field of Classification Search
CPC ... H01L 23/04; H01L 23/5384; H01L 23/564; H01L 23/5226; H01L 21/56; H01L 21/76898; H01L 23/3171; H01L 23/481; H01L 23/522; H01L 23/562; H01L 23/585; H10D 84/83; H10W 76/12; H10W 42/00; H10W 70/611; H10W 70/635; H10W 42/121; H10W 20/42; H10W 20/023; H10W 20/20; H10W 20/40; H10W 74/01; H10W 74/137
See application file for complete search history.

(56) References Cited

U.S. PATENT DOCUMENTS

2010/0237472 A1* 9/2010 Gillis .................... H01L 21/743
257/E21.597
2013/0299948 A1 11/2013 Tsutsue et al.
(Continued)

OTHER PUBLICATIONS

Search Report from European Patent Application No. 22204881.1, mailed Jun. 7, 2023, 12 pgs.
(Continued)

*Primary Examiner* — Cuong B Nguyen
(74) *Attorney, Agent, or Firm* — Schwabe, Williamson & Wyatt P.C.

(57) ABSTRACT

Embodiments described herein may be related to apparatuses, processes, and techniques for providing a hermetic seal for a layer of transistors with metal on both sides that are on a substrate. The layer of transistors may be within a die or within a portion of a die. The hermetic seal may include a hermetic layer on one side of the layer of transistors and a hermetic layer on the opposite side of the transistors. In embodiments, one or more metal walls may be constructed through the transistor layer, with metal rings placed around either side of the layer of transistors and hermetically coupling with the two hermetic layers. Other embodiments may be described and/or claimed.

19 Claims, 14 Drawing Sheets

(51)  Int. Cl.
     *H10W 42/00*     (2026.01)
     *H10W 70/60*     (2026.01)
     *H10W 70/63*     (2026.01)
     *H10W 76/12*     (2026.01)

(56)  References Cited

U.S. PATENT DOCUMENTS

2020/0135664 A1 *  4/2020  Tseng .................... H01L 21/486
2022/0352044 A1 *  11/2022  Fan ....................... H01L 23/585

OTHER PUBLICATIONS

Search Report from European Patent Application No. 22204881.1, mailed Oct. 13, 2023, 13 pgs.

\* cited by examiner

703

704

734    734

702

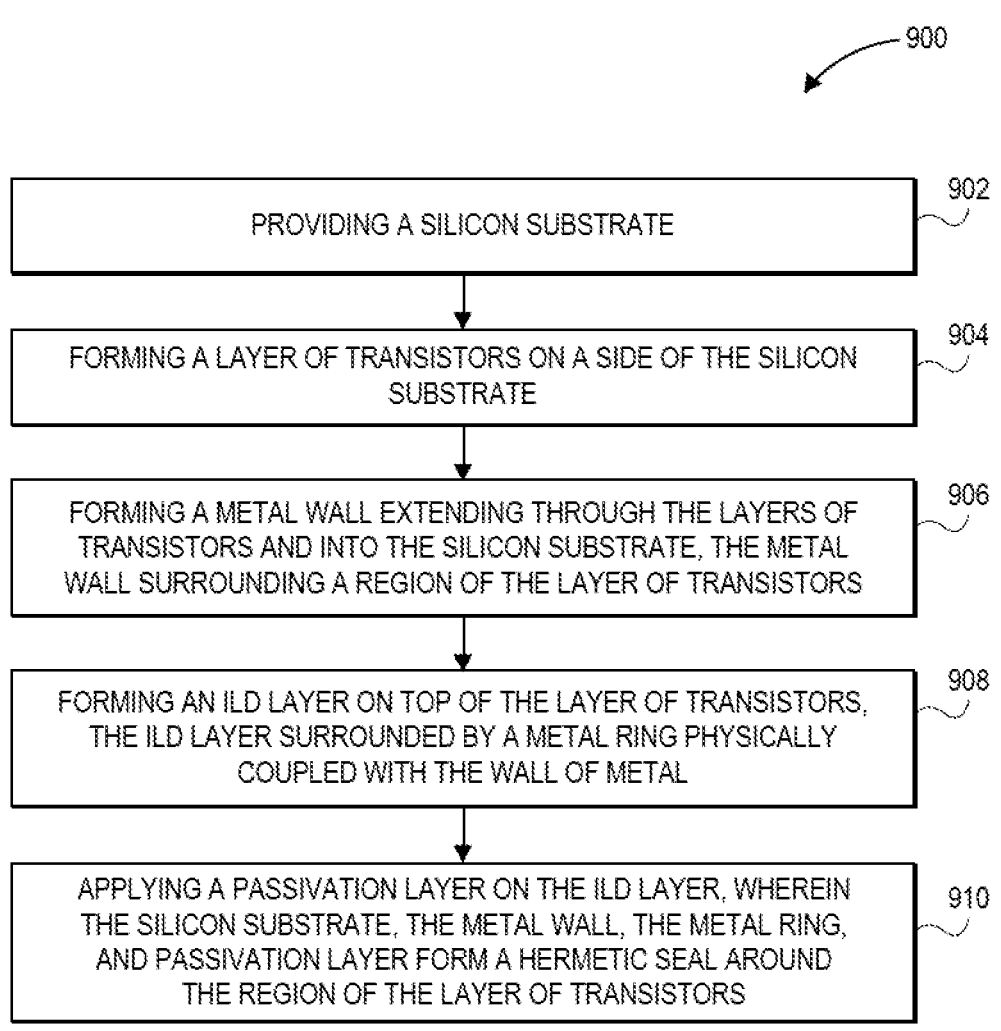

900

| | |
|---|---|
| PROVIDING A SILICON SUBSTRATE | 902 |
| FORMING A LAYER OF TRANSISTORS ON A SIDE OF THE SILICON SUBSTRATE | 904 |
| FORMING A METAL WALL EXTENDING THROUGH THE LAYERS OF TRANSISTORS AND INTO THE SILICON SUBSTRATE, THE METAL WALL SURROUNDING A REGION OF THE LAYER OF TRANSISTORS | 906 |
| FORMING AN ILD LAYER ON TOP OF THE LAYER OF TRANSISTORS, THE ILD LAYER SURROUNDED BY A METAL RING PHYSICALLY COUPLED WITH THE WALL OF METAL | 908 |
| APPLYING A PASSIVATION LAYER ON THE ILD LAYER, WHEREIN THE SILICON SUBSTRATE, THE METAL WALL, THE METAL RING, AND PASSIVATION LAYER FORM A HERMETIC SEAL AROUND THE REGION OF THE LAYER OF TRANSISTORS | 910 |

FIG. 9

HERMETIC SEAL FOR TRANSISTORS WITH METAL ON BOTH SIDES

FIELD

Embodiments of the present disclosure generally relate to the field of semiconductor packaging, and in particular to transistor structures with metal on both sides.

BACKGROUND

Continued growth in virtual machines, cloud computing, and portable devices will continue to increase the demand for high density transistors within chips and packages.

BRIEF DESCRIPTION OF THE DRAWINGS

FIG. 9 illustrates an example process for manufacturing a package that includes a hermetic seal for a transistor structure that includes metal on both sides, in accordance with various embodiments.

DETAILED DESCRIPTION

Figure 1:
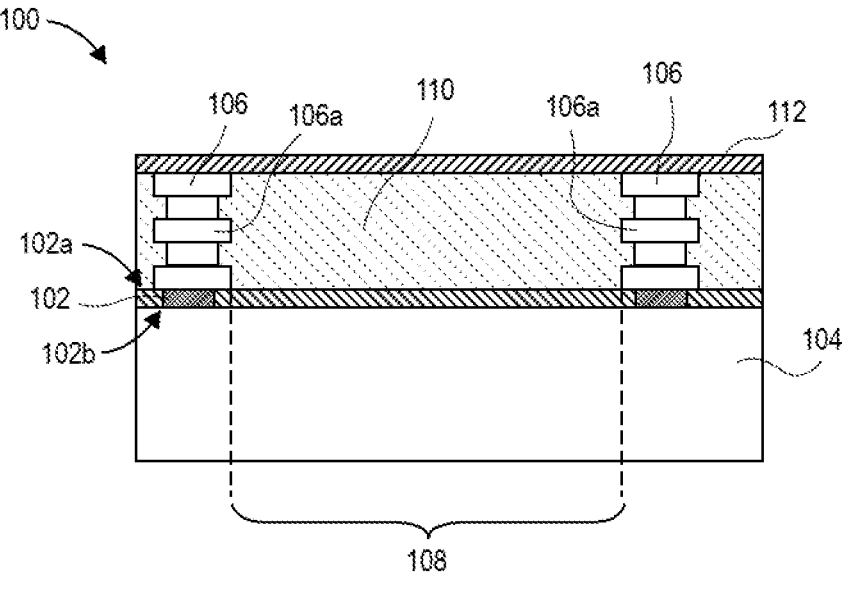
FIG. 1 shows a cross section side view of a substrate with a 2D transistor layer with metal routing on one side of the transistor layer that is hermetically sealed by a metal ring and a top passivation layer.

Embodiments described herein may be related to apparatuses, processes, systems, and techniques directed to providing a hermetic seal for a layer of transistors with metal on both sides. In embodiments, the layer of transistors may be on a substrate within a die or within a portion of a die. In embodiments, the hermetic seal may include a hermetic layer on one side of the layer of transistors and a hermetic layer on the opposite side of the transistors. In embodiments, one or more TSV walls may be constructed through the transistor layer, with metal rings placed around the layer of transistors and hermetically coupling with the two hermetic layers. In embodiments, metal rings may be coupled with a silicon layer in the middle of the transistor layer and hermetically coupled with the two hermetic layers. In embodiments, metal rings may be coupled with a silicon island wall formed through a transistor fin manufacturing process on one side of the transistor layer.

Semiconductors, including transistors, use different materials which may either degrade or corrode in the presence of moisture. If circuits made using these materials are not protected from moisture, they may either decrease in performance or cease to work. Therefore, in legacy implementations, a hermetic ring around the die edge and a hermetic passivation at the top layer are typically placed to prevent moisture from entering into the circuits for transistors with only one metal side. In addition, the ring around the die edge may help arrest edge cracks and may facilitate better thermo-mechanical reliability. However, with transistors having metal on both sides where metal is used to route from both sides (top and bottom) of the transistor, there may be limited moisture blocking at a die edge using these legacy techniques.

In embodiments, transistors with metal on both sides may be used to separate signal and power delivery at two different sides of the transistor. This may facilitate die size reduction and improve circuit performance. In embodiments, hermetically sealing both sides of a transistor with metal on both sides will prevent or minimize moisture-related degradation of the transistor, and provide better integrity for thermo-mechanical stress during operation, thus improving package reliability for transistors with metal on both sides.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 shows a cross section side view of a substrate with a 2D transistor layer with metal routing on one side of the transistor layer that is hermetically sealed by a metal ring and a top passivation layer. Legacy die 100 shows a 2D transistor layer 102 that includes a metal side 102a and a non-metal side 102b. 2D transistor layer 102 is on top of a substrate 104. In implementations, the substrate 104 may be a silicon substrate. One or more metal rings 106 within one or more dielectric layers 110 may completely surround a portion of the transistor layer 108. In implementations, a top of the metal rings 106 and a top dielectric layer 110 may be covered by a top hermetic passivation layer 112. In this configuration, the metal side 102a of the transistor layer 102 may be hermetically sealed by the silicon substrate 104, the one or more metal rings 106, and the top hermetic passivation layer 112. Metal rings 106 and transistor layer 102 forms walls around die 100 edges and silicon 104 and passivation 112 forms the base and the roof of the die 100. Because these materials are all hermetic, the entire housing including walls, base, and roof are hermetic, thus protecting the inside of the die 100 from external moisture.

Figure 2:
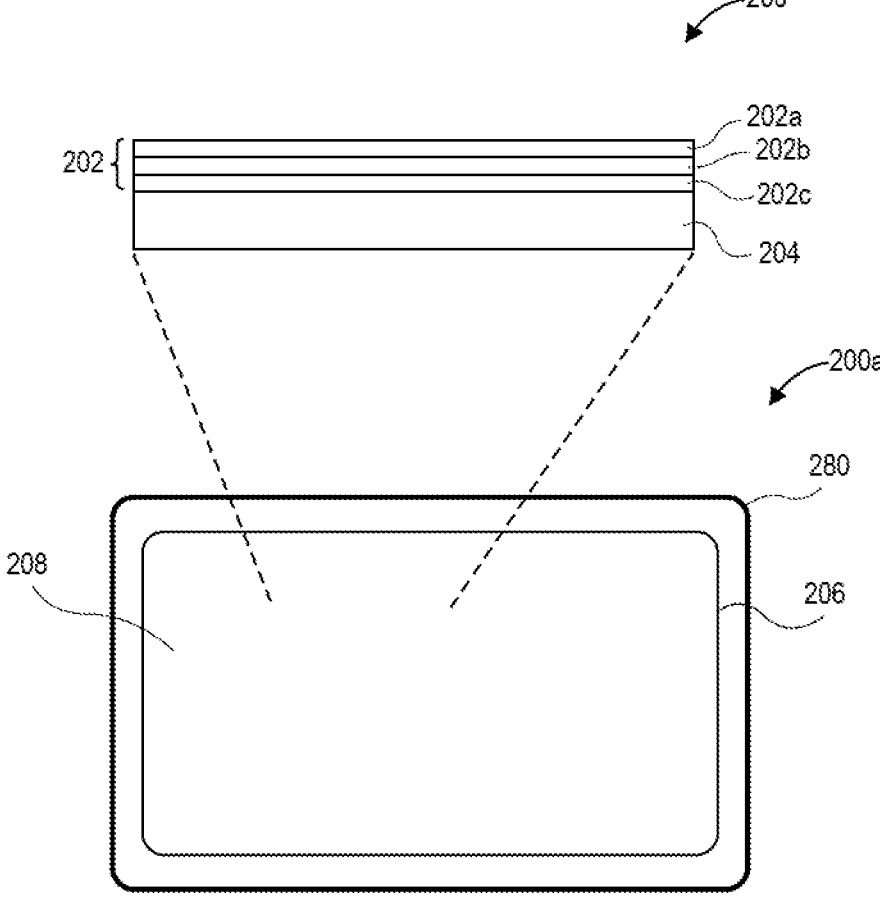
FIG. 2 shows a cross-section side view and a top-down view of a substrate that includes a transistor layer with metal on both sides, in accordance with various embodiments.

FIG. 2 shows a cross-section side view and a top-down view of a substrate that includes a transistor layer with metal on both sides, in accordance with various embodiments. Substrate cross section 200 shows a substrate 204, which may be similar to substrate 104 of FIG. 1, with a transistor layer with metal on both sides 202 on top. Note that various conductive routings within the substrate 204 are not shown for clarity. The transistor layer is broken into three layers that include a first metal layer 202a, a non-metal layer 202b, which may be a silicon layer, and a second metal layer 202c. In implementations, the first metal layer 202a may be used for routing signal, and the second metal layer 202c may be used for power distribution. Die 200a is a top-down view of a die that includes the substrate 200, with an edge of the die 280, a hermetic ring 206 that surrounds a transistor region 208 of the substrate 204 that is used, in part, to prevent moisture from entering an edge of the transistor region 208. In embodiments, transistor region 208 may be similar to the portion of the transistor region 108 of FIG. 1.

Figures 3, 4, 5:
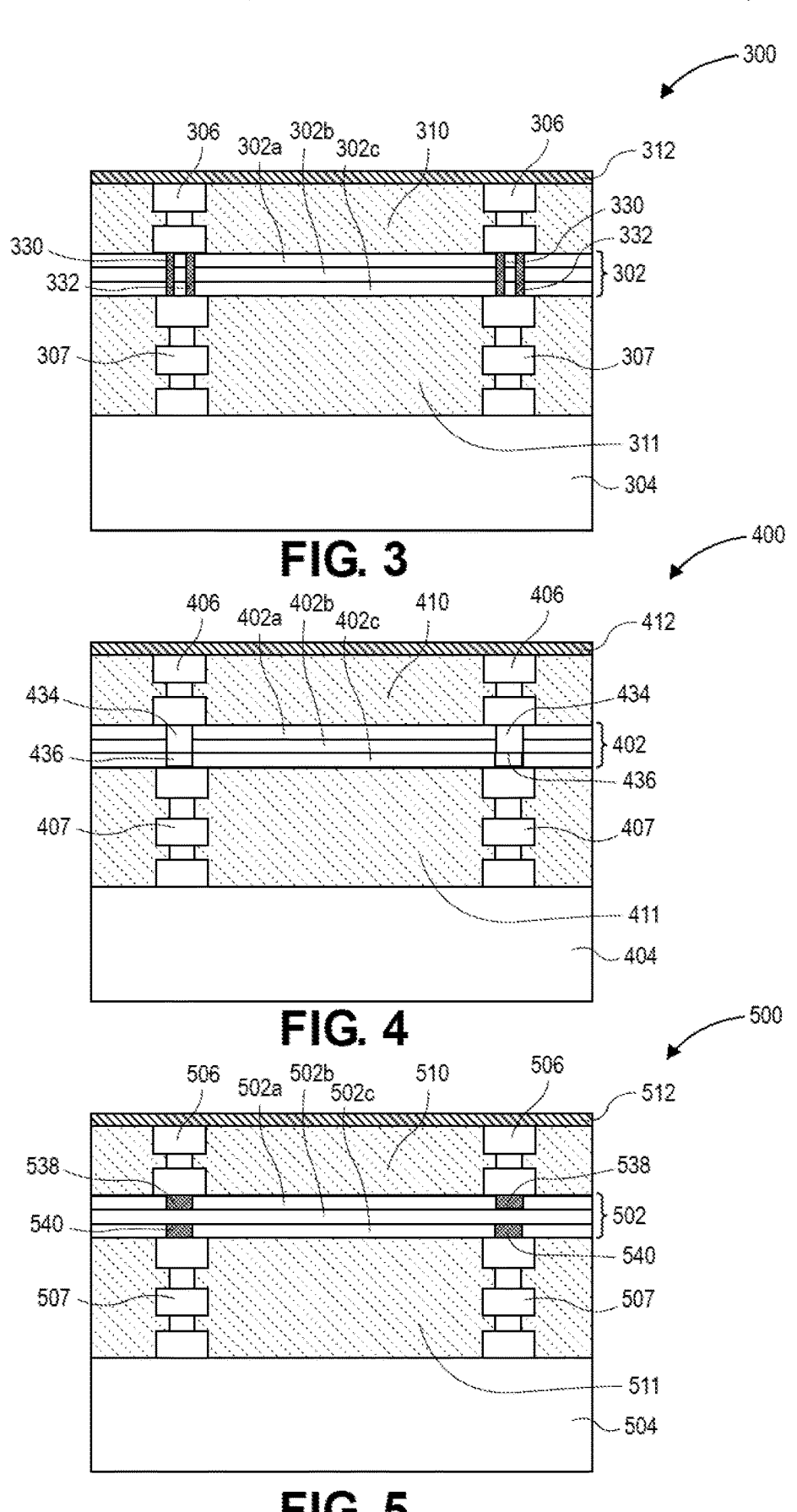
FIG. 3 shows a cross section side view of a substrate with a transistor layer with metal on both sides that includes a double through silicon via (TSV) wall with metal rings placed on both sides of the double TSV wall to hermetically seal the transistor layer, in accordance with various embodiments.
FIG. 4 shows a cross section side view of a substrate with a transistor layer with metal on both sides that includes metal rings coupled with the silicon layer in the middle of the transistor layer to hermetically seal the transistor layer, in accordance with various embodiments.
FIG. 5 shows a cross section side view of a substrate with a transistor layer with metal on both sides that includes a metal ring coupled with a silicon island wall formed through a transistor fin manufacturing process on one side of the transistor layer, in accordance with various embodiments.

FIG. 3 shows a cross section side view of a substrate with a transistor layer with metal on both sides that includes a double TSV wall with metal rings placed on both sides of the double TSV wall to hermetically seal the transistor layer, in accordance with various embodiments. Substrate 300 shows an embodiment of a transistor layer 302 that is metal on both sides, and includes a first metal side 302a, a second metal side 302c, and a non-metal layer 302b, which may be similar to first metal side 202a, a second metal side 202c, and a non-metal layer 202b of FIG. 2.

A first metal wall 330 and a second metal wall 332 encapsulate a portion of the transistor layer 302. In embodiments, the first metal wall 330 or the second metal wall 332 may be similar to wall 206 of FIG. 2. In some embodiments, there may be only one metal wall, and other embodiments there may be multiple metal walls encapsulating a portion of the transistor layer 302. In embodiments, the metal walls may be created by forming a TSV trench extending from the first metal side 302a through to the second metal side 302c. The formed TSV trench may then be filled with a metal material, or with some other material that provides a hermetic barrier to moisture. In embodiments, the TSV trench may be a nano-TSV trench. In embodiments, the first metal wall 330 and the second metal wall 332 may be made of any material that provides a hermetic barrier to moisture.

A first metal ring 306 may then be formed above the transistor layer 302, and extend upward until it reaches a hermetic barrier, such as hermetic passivation layer 312. The first metal ring 306 may be in direct physical contact with the first metal wall 330 and the second metal wall 332 in order to provide a hermetic seal that is a barrier to moisture. A second metal ring 307 may be formed below the transistor layer 302, and extend downward until it reaches a hermetic barrier, such as a silicon substrate 304. Note that the first metal ring 306 and the second metal ring 307 may be formed by multiple layers of dielectric and metal 310, 311, into which TSVs may be formed and filled with a metal, as described in greater detail below with respect to FIGS. 6A-6G.

FIG. 4 shows a cross section side view of a substrate with a transistor layer with metal on both sides that includes metal rings coupled with the silicon layer in the middle of the transistor layer to hermetically seal the transistor layer, in accordance with various embodiments. Substrate 400 shows an embodiment of a transistor layer 402 that is metal on both sides, and includes a first metal side 402a, a second metal side 402c, and a non-metal layer 402b, which may be similar to first metal side 202a, a second metal side 202c, and a non-metal layer 202b of FIG. 2.

A silicon island wall 434 may be formed, extending from the middle non-metal layer 402, which may be silicon, through the top metal layer 402a. The silicon island wall 434 may extend all the way around the transistor layer 402, which may be similar to metal ring 206 of FIG. 2. In embodiments, the silicon island wall 434 may be manufactured using 3D transistor fin processing techniques that may be applied to the front side of the transistor layer 402. In embodiments, the silicon island wall 434 may be directly physically coupled with the first metal ring 406 to provide a hermetic seal. In embodiments, a metal ring 436 may be formed within the second metal side 402c, and may directly physically couple with the second metal ring 407 as described further below.

The first metal ring 406 may be formed above the transistor layer 402, and extend upward until it reaches a hermetic barrier, such as hermetic passivation layer 412. The second metal ring 407 may be formed below the transistor layer 402, and extend downward until it reaches a hermetic barrier, such as a silicon substrate 404. Note that the first metal ring 406 and the second metal ring 407 may be formed by multiple layers of dielectric and metal 410, 411, into which TSVs may be formed and filled with a metal, as described in greater detail below with respect to FIGS. 7A-7G.

FIG. 5 shows a cross section side view of a substrate with a transistor layer with metal on both sides that includes a metal ring coupled with a silicon island wall formed through a transistor fin manufacturing process on one side of the transistor layer, in accordance with various embodiments. Substrate 500 shows an embodiment of a transistor layer 502 that is metal on both sides, and includes a first metal side 502a, a second metal side 502c, and a non-metal layer 502b, which may be similar to first metal side 202a, a second metal side 202c, and a non-metal layer 202b of FIG. 2.

A first metal gasket 538 may be placed within the first metal side 502a, and a second metal gasket 540 may be placed within the second metal side 502c. In embodiments, the first metal gasket 538 and the second metal gasket 540 would come into direct physical contact with the non-metal layer 502b, which may be made of silicon. The result of this direct physical contact would be a hermetic barrier. The first metal gasket 538 may be coupled with the first metal ring 506, and the second metal gasket 540 may be coupled with the second metal ring 507.

The first metal ring 506 may be formed above the transistor layer 502, and extend upward until it reaches a hermetic barrier, such as hermetic passivation layer 512. The second metal ring 507 may be formed below the transistor layer 502, and extend downward until it reaches a hermetic barrier, such as a silicon substrate 504. Note that the first metal ring 506 and the second metal ring 507 may be formed by multiple layers of dielectric and metal 510, 511, into which TSVs may be formed and filled with a metal, as described in greater detail below with respect to FIGS. 8A-8G.

Figure 6A:
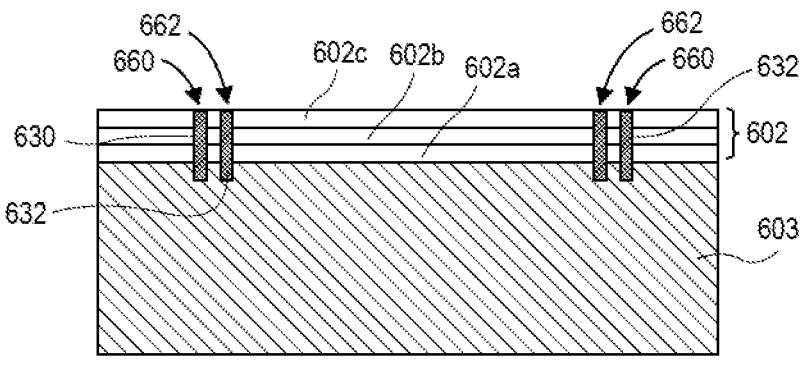
FIGS. 6A-6G illustrate stages in a manufacturing process for creating a substrate with a transistor layer with metal on both sides that includes a double TSV wall with metal rings placed on both sides of the double TSV wall to hermetically seal the transistor layer, in accordance with various embodiments.

FIGS. 6A-6G illustrate stages in a manufacturing process for creating a substrate with a transistor layer with metal on both sides that includes a double through silicon via (TSV) wall with metal rings placed on both sides of the double TSV wall to hermetically seal the transistor layer, in accordance with various embodiments. FIG. 6A shows a stage in the manufacturing process where a transistor layer with both metal sides 602 is placed on a silicon substrate 603. In embodiments, the transistor layer 602 includes a first metal side 602a, a second metal side 602c, and a non-metal layer 602b.

Through silicon via trenches 660, 662 are created and extend through the transistor layer 602, and into the silicon substrate 603. In embodiments, the through silicon via trenches 660, 662 may be nano through silicon via trenches. In embodiments, trenches 660 and 662 around a die edge can be created using through silicon via trench techniques. Subsequent to the creation of the trenches 660, 662, they may be filled with a metal material to form metal walls 630, 632 that surround a region of the transistor layer 602. In embodiments, the metal walls 630, 632 may be similar or different to metal walls 330, 332 of FIG. 3

Figure 6B:
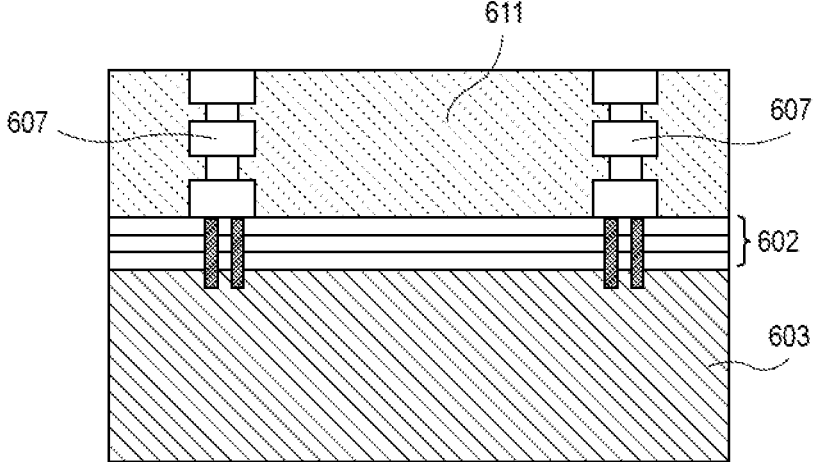

FIG. 6B shows a stage in the manufacturing process where one or more dielectric layers that include one or more metal rings are added. In embodiments, dielectric layers 611 may be added on top of the transistor layer 602. For each dielectric layer 611, a portion of a first metal ring 607 may be formed, for example by etching a via through the dielectric layer 611 and filling the etched void with a metal.

Figure 6C:
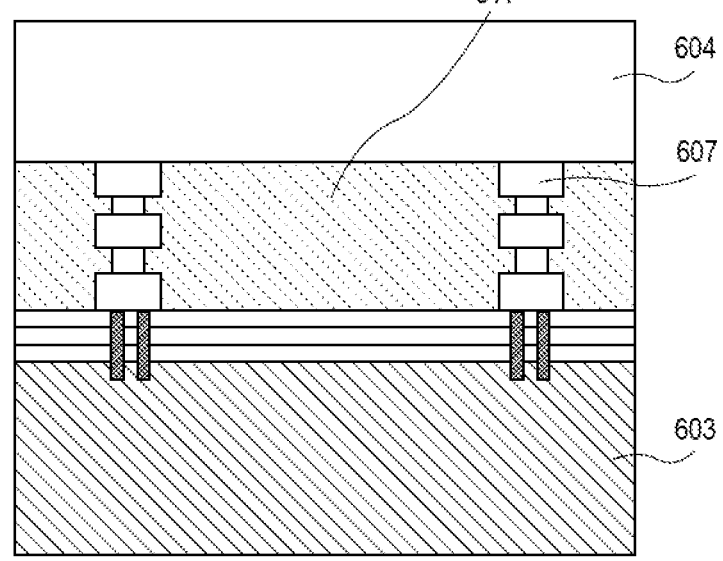

FIG. 6C shows a stage in the manufacturing process where a carrier substrate 604, which may be similar to substrate 304 of FIG. 3, is applied to the dielectric layers 611 and the first metal rings 607.

Figure 6D:
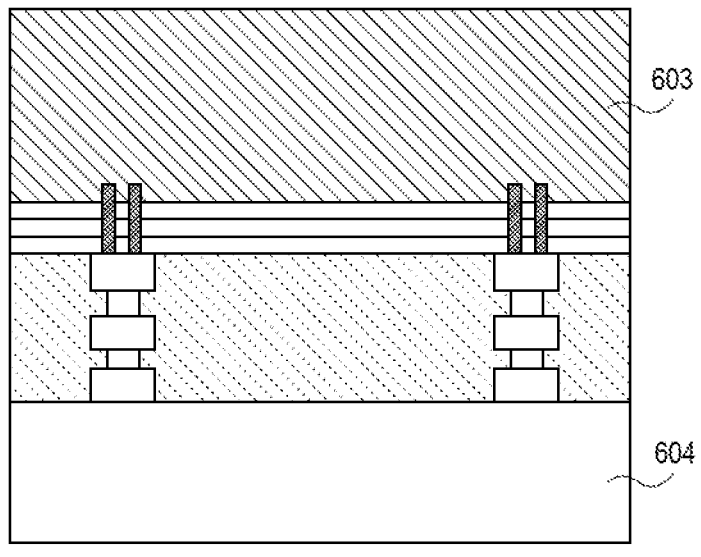

FIG. 6D shows a stage in the manufacturing process where the wafer is flipped.

Figure 6E:
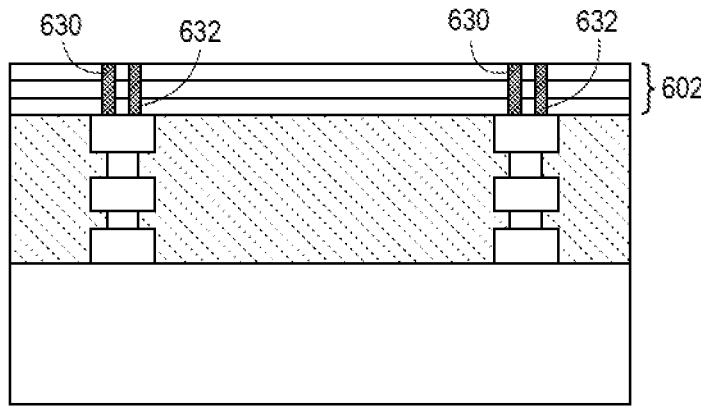

FIG. 6E shows a stage in the manufacturing process where the silicon substrate 603 is ground and polished to reveal the metal walls 630, 632 at the back of the transistor layer 602.

Figure 6F:
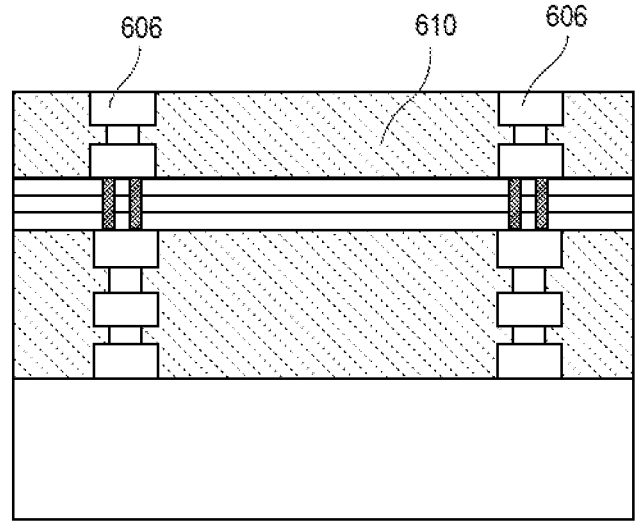

FIG. 6F shows a stage in the manufacturing process where another set of one or more dielectric layers that include one or more metal rings are added. In embodiments, dielectric layers 610 may be added on to transistor layer 602 on the side opposite the dielectric layers 611. For each dielectric layer 610, a portion of a first metal ring 606 may be formed, for example by etching a via through the dielectric layer 610 and filling the etched void with a metal.

Figure 6G:
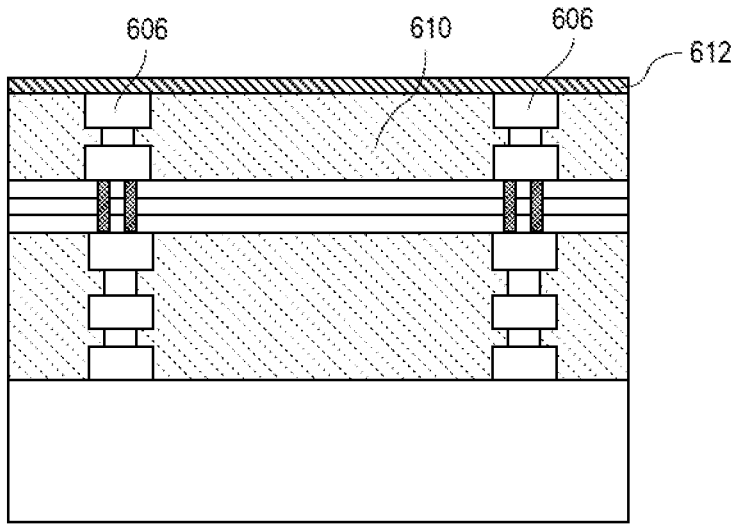

FIG. 6G shows a stage in the manufacturing process where a hermetic passivation layer 612 is applied onto the dielectric layer 610 and top portion of the first metal ring 606.

Figure 7A:
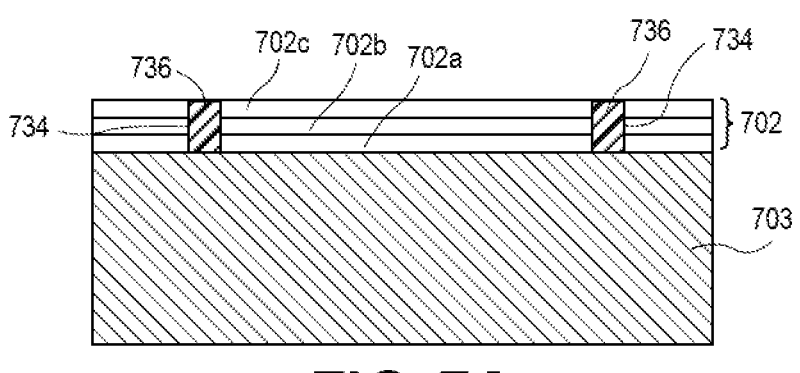
FIGS. 7A-7G illustrate stages in a manufacturing process to create a substrate with a transistor layer with metal on both sides that includes metal rings coupled with the silicon layer in the middle of the transistor layer to hermetically seal the transistor layer, in accordance with various embodiments.

FIGS. 7A-7G illustrate stages in a manufacturing process to create a substrate with a transistor layer with metal on both sides that includes metal rings coupled with the silicon layer in the middle of the transistor layer to hermetically seal the transistor layer, in accordance with various embodiments. FIG. 7A shows a stage in the manufacturing process where a transistor layer with both metal sides 702 is placed on a silicon substrate 703. In embodiments, the transistor layer 702 includes a first metal side 702a, a second metal side 702c, and a non-metal layer 702b.

A silicon island wall 734 may be formed, extending from the middle non-metal layer 702b through the top metal side 702a. The silicon island wall 734 may extend all the way around the transistor layer 702, which may be similar to metal ring 206 of FIG. 2. In embodiments, the silicon island wall 734 may be manufactured using 3D transistor fin processing techniques that may be applied to the front side of the transistor layer 702. In embodiments, the silicon island wall 734 may be directly physically coupled with a metal ring 736 and may be formed within the second metal side 702c. In embodiments, the silicon island wall 734 and the metal ring 736 may be similar to silicon island wall 434 and metal ring 436 of FIG. 4.

Figure 7B:
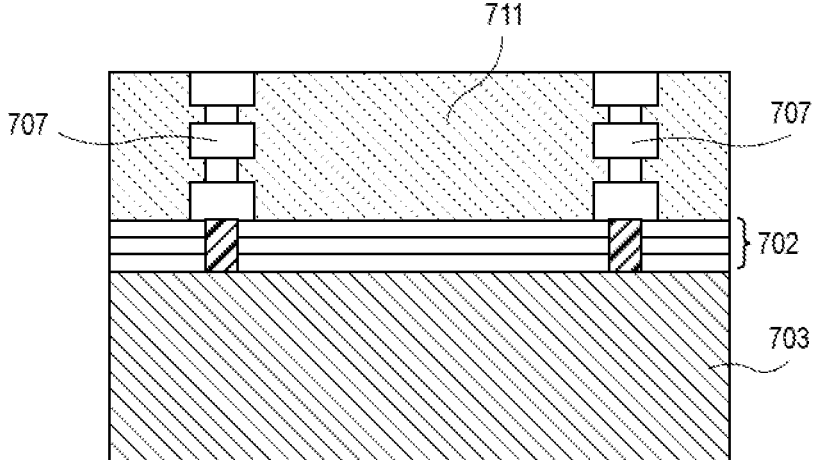

FIG. 7B shows a stage in the manufacturing process where one or more dielectric layers that include one or more metal rings are added. In embodiments, dielectric layers 711 may be added on top of the transistor layer 702. For each dielectric layer 711, a portion of a first metal ring 707 may be formed, for example by etching a via through the dielectric layer 711 and filling the etched void with a metal.

Figure 7C:
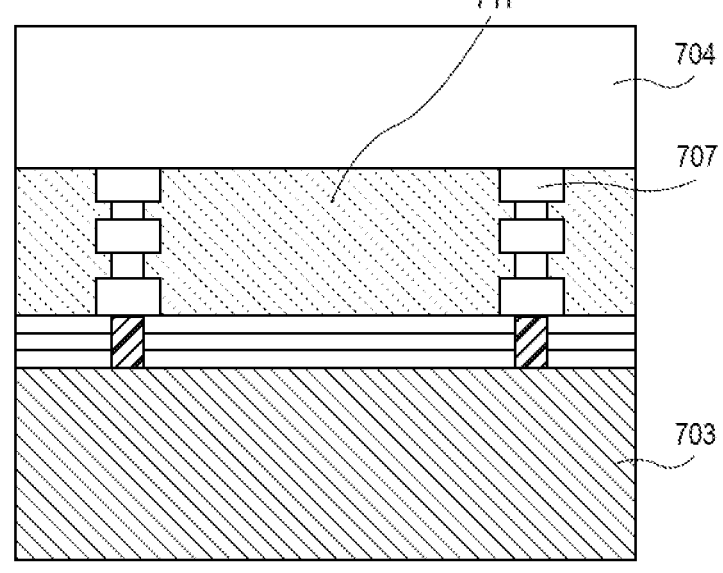

FIG. 7C shows a stage in the manufacturing process where a carrier substrate 704, which may be similar to substrate 404 of FIG. 4, is applied to the dielectric layers 711 and the first metal rings 707.

Figures 7D, 7E:
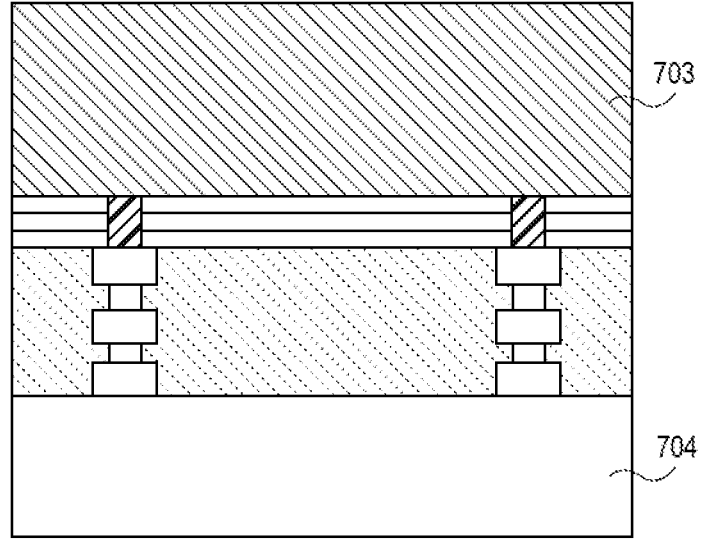

FIG. 7D shows a stage in the manufacturing process where the wafer is flipped.

FIG. 7E shows a stage in the manufacturing process where the silicon substrate 703 is ground and polished to reveal the silicon island wall 734 at the top of the transistor layer 702.

Figure 7F:
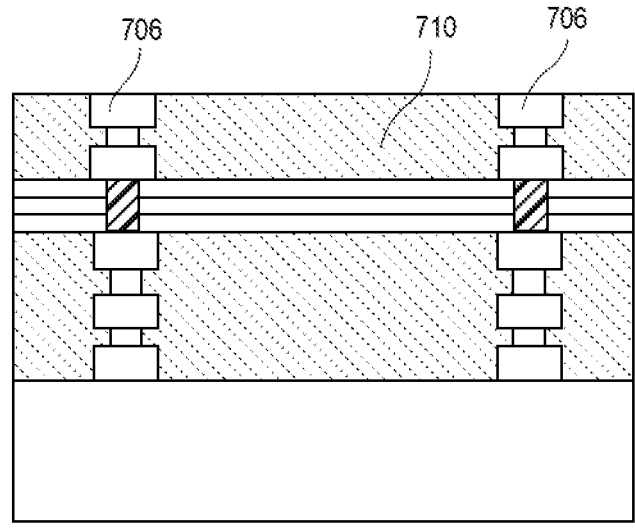

FIG. 7F shows a stage in the manufacturing process where another set of one or more dielectric layers that include one or more metal rings are added. In embodiments, dielectric layers 710 may be added on to transistor layer 702 on the side opposite the dielectric layers 711. For each dielectric layer 710, a portion of a first metal ring 706 may be formed, for example by etching a via through the dielectric layer 710 and filling the etched void with a metal.

Figure 7G:
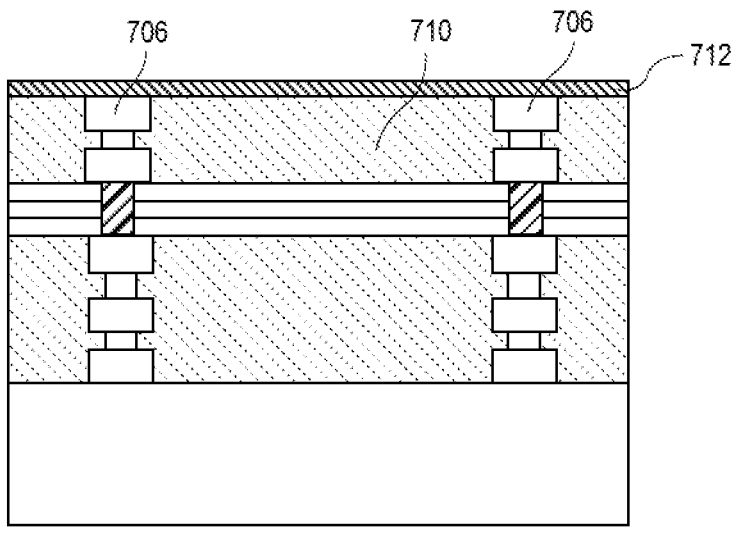

FIG. 7G shows a stage in the manufacturing process where a hermetic passivation layer 712 is applied onto the dielectric 710 and top portion of the first metal ring 706.

Figure 8A:
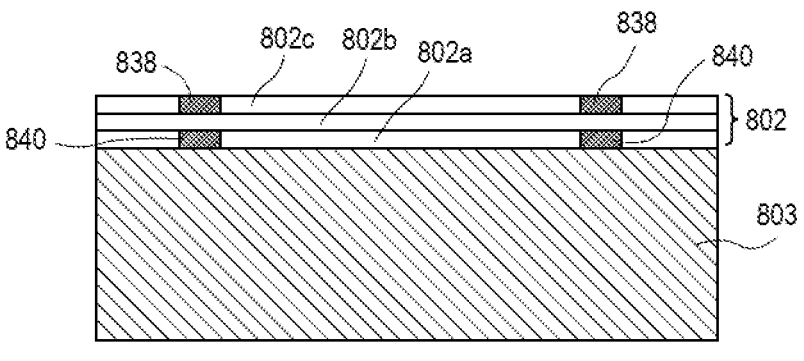
FIGS. 8A-8G illustrate stages in a manufacturing process to create a substrate with a transistor layer with metal on both sides that includes a metal ring coupled with a silicon island wall formed through a transistor fin manufacturing process on one side of the transistor layer, in accordance with various embodiments.

FIGS. 8A-8G illustrate stages in a manufacturing process to create a substrate with a transistor layer with metal on both sides that includes a metal ring coupled with a silicon island wall formed through a transistor fin manufacturing process on one side of the transistor layer, in accordance with various embodiments. FIG. 8A shows a stage in the manufacturing process where a transistor layer with both metal sides 802 is placed on a silicon substrate 803. In embodiments, the transistor layer 802 includes a first metal side 802*a*, a second metal side 802*c*, and a non-metal layer 802*b*.

A first metal gasket 838 may be formed within the second metal side 802*c* and a second metal gasket 840 may be formed within the first metal side 802*a* of the transistor layer 802. In embodiments, the first metal gasket 838 and the second metal gasket 840 will be physically coupled by a silicon layer 802*b* and form a hermetic seal. In embodiments, the first metal gasket 838 and the second metal gasket 840 may be similar to first metal gasket 538 and the second metal gasket 540 of FIG. 5.

Figure 8B:
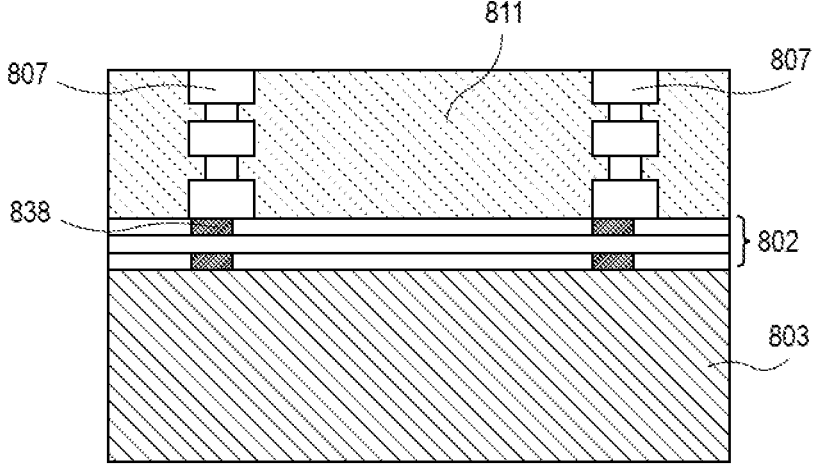

FIG. 8B shows a stage in the manufacturing process where one or more dielectric layers that include one or more metal rings are added. In embodiments, dielectric layers 811 may be added on top of the transistor layer 802. For each dielectric layer 811, a portion of a first metal ring 807 may be formed, for example by etching a via through the dielectric layer 811 and filling the etched void with a metal. In embodiments, the first metal gasket 838 may be directly physically coupled with the first metal ring 807.

Figure 8C:
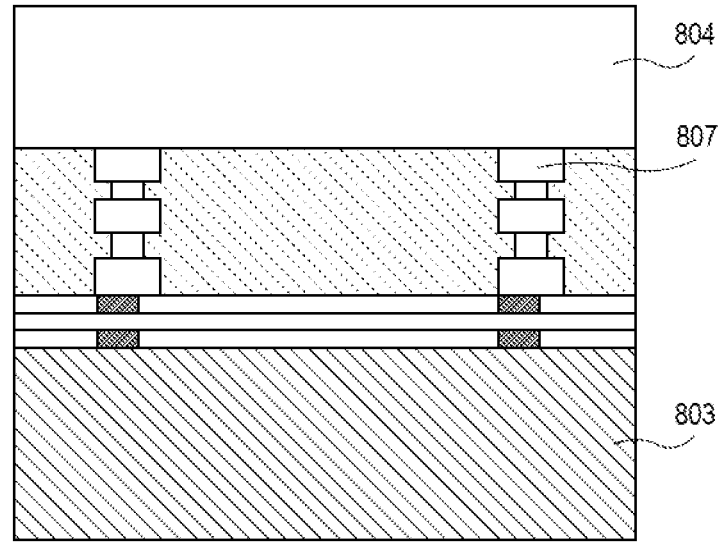

FIG. 8C shows a stage in the manufacturing process where a carrier substrate 804, which may be similar to substrate 504 of FIG. 5, is applied to the dielectric layers 811 and the first metal rings 807.

Figure 8D:
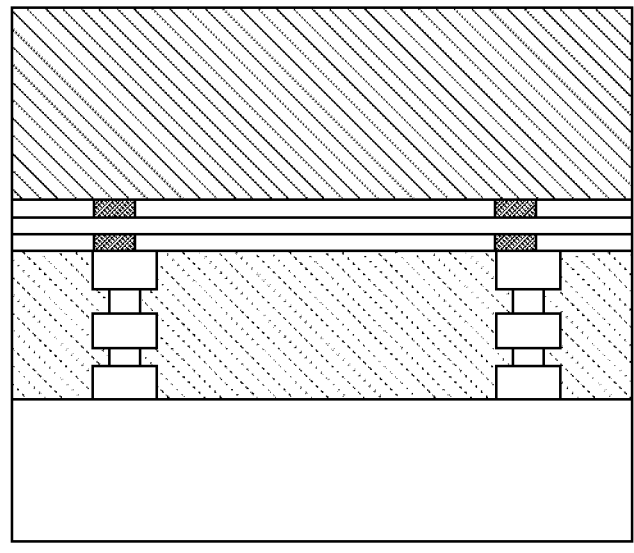

FIG. 8D shows a stage in the manufacturing process where the wafer is flipped.

Figure 8E:
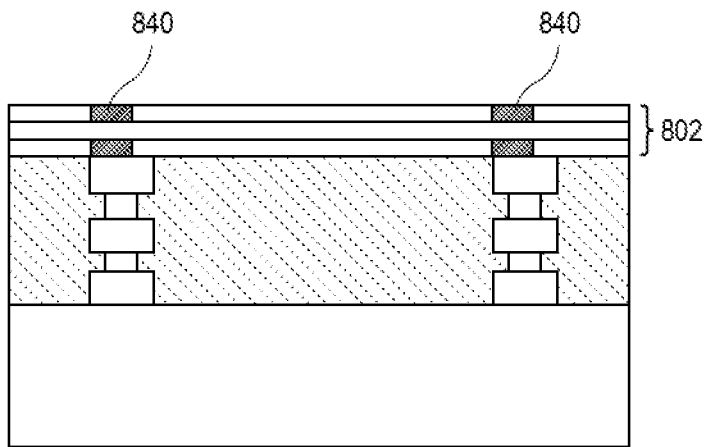

FIG. 8E shows a stage in the manufacturing process where the silicon substrate 803 is ground and polished to reveal the second metal gasket 840 at the top of the transistor layer 802.

Figure 8F:
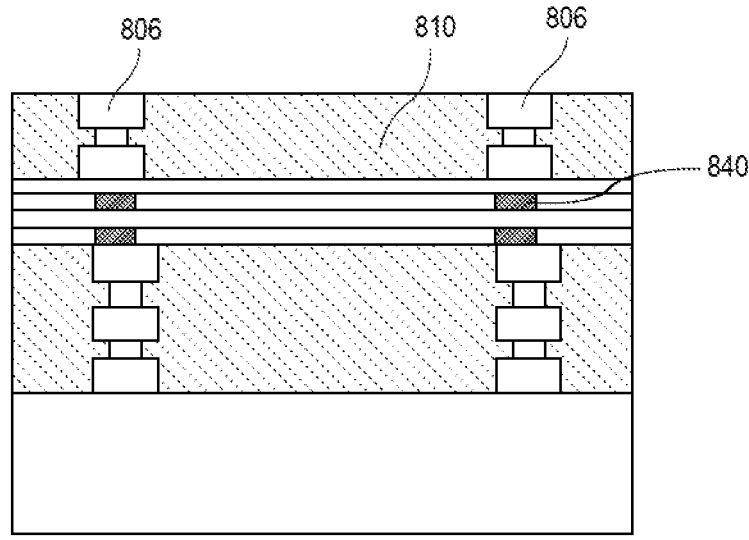

FIG. 8F shows a stage in the manufacturing process where another set of one or more dielectric layers that include one or more metal rings are added. In embodiments, dielectric layers 810 may be added on to transistor layer 802 on the side opposite the dielectric layers 811. For each dielectric layer 810, a portion of a first metal ring 806 may be formed, for example by etching a via through the dielectric layer 810 and filling the etched void with a metal. In embodiments, the second metal gasket 840 may be directly physically coupled with the second metal ring 806.

Figure 8G:
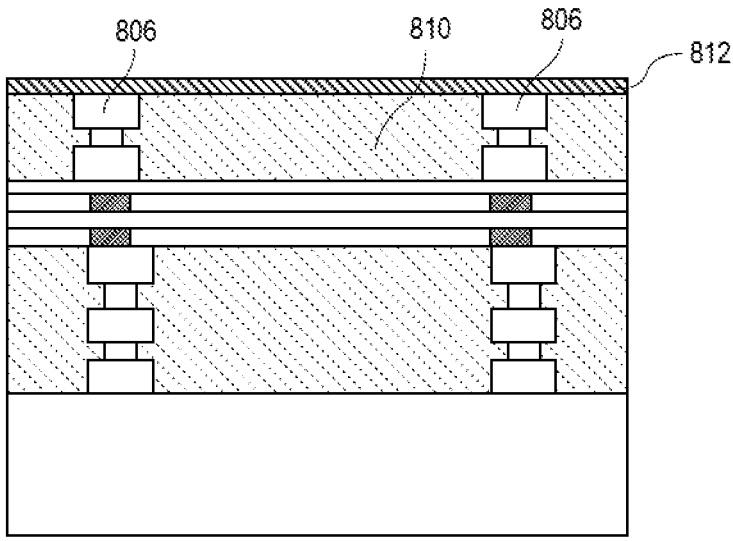

FIG. 8G shows a stage in the manufacturing process where a hermetic passivation layer 812 is applied onto the dielectric 810 and top portion of the first metal ring 806.

FIG. 9 illustrates an example process for manufacturing a package that includes a hermetic seal for a transistor structure that includes metal on both sides, in accordance with various embodiments. Process 900 may be implemented using the techniques and/or embodiments described herein, and in particular with respect to FIGS. 1-8G.

At block 902, the process may include providing a silicon substrate. In embodiments, the silicon substrate may be similar to silicon substrate 304 of FIG. 3

At block 904, the process may further include forming a layer of transistors on a side of the silicon substrate. In embodiments, the layer of transistors may be similar to transistor layer 302 of FIG. 3, that includes metal on both sides transistors.

At block 906, the process may further include forming a metal wall extending through the layers of transistors and into the silicon substrate, the metal wall surrounding a region of the layer of transistors. In embodiments, the metal wall may be similar to metal walls 330, 332 of FIG. 3.

At block 908, the process may further include forming an ILD layer on top of the layer of transistors, the ILD layer surrounded by a metal ring physically coupled with the wall of metal. In embodiments, the ILD layer may be similar to a dielectric layer 310, and metal ring may be similar to first metal ring 306 of FIG. 3.

At block 910, the process may further include applying a passivation layer on the ILD layer, wherein the silicon substrate, the metal wall, the metal ring, and passivation layer form a hermetic seal around the region of the layer of transistors. In embodiments, the passivation layer may be similar to passivation layer 312 of FIG. 3.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanorib-bon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 10:
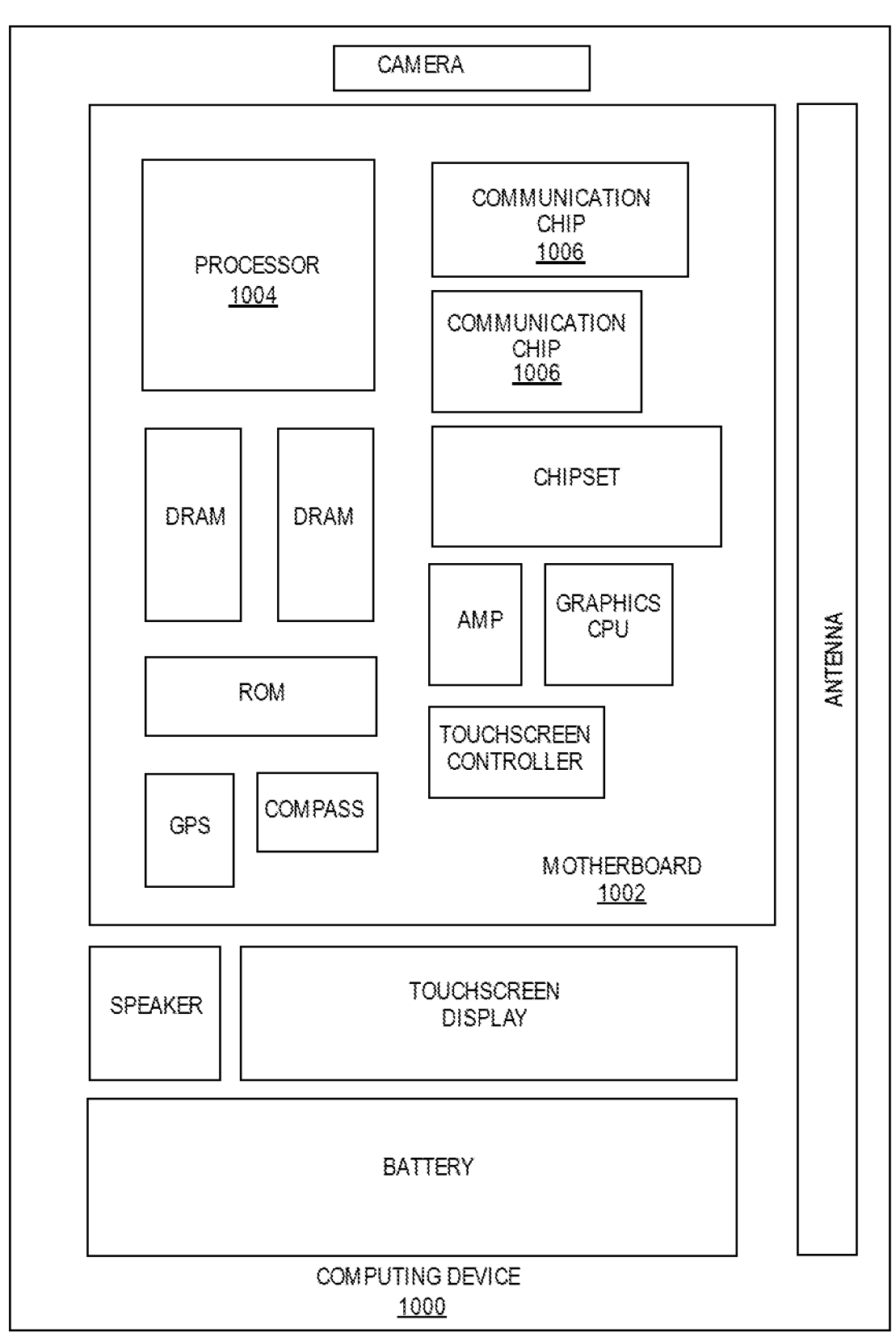
FIG. 10 illustrates a computing device in accordance with one implementation of the invention.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as MOS-FET transistors built in accordance with implementations of the invention.

In further implementations, another component housed within the computing device 1000 may contain an integrated circuit die that includes one or more devices, such as MOS-FET transistors built in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
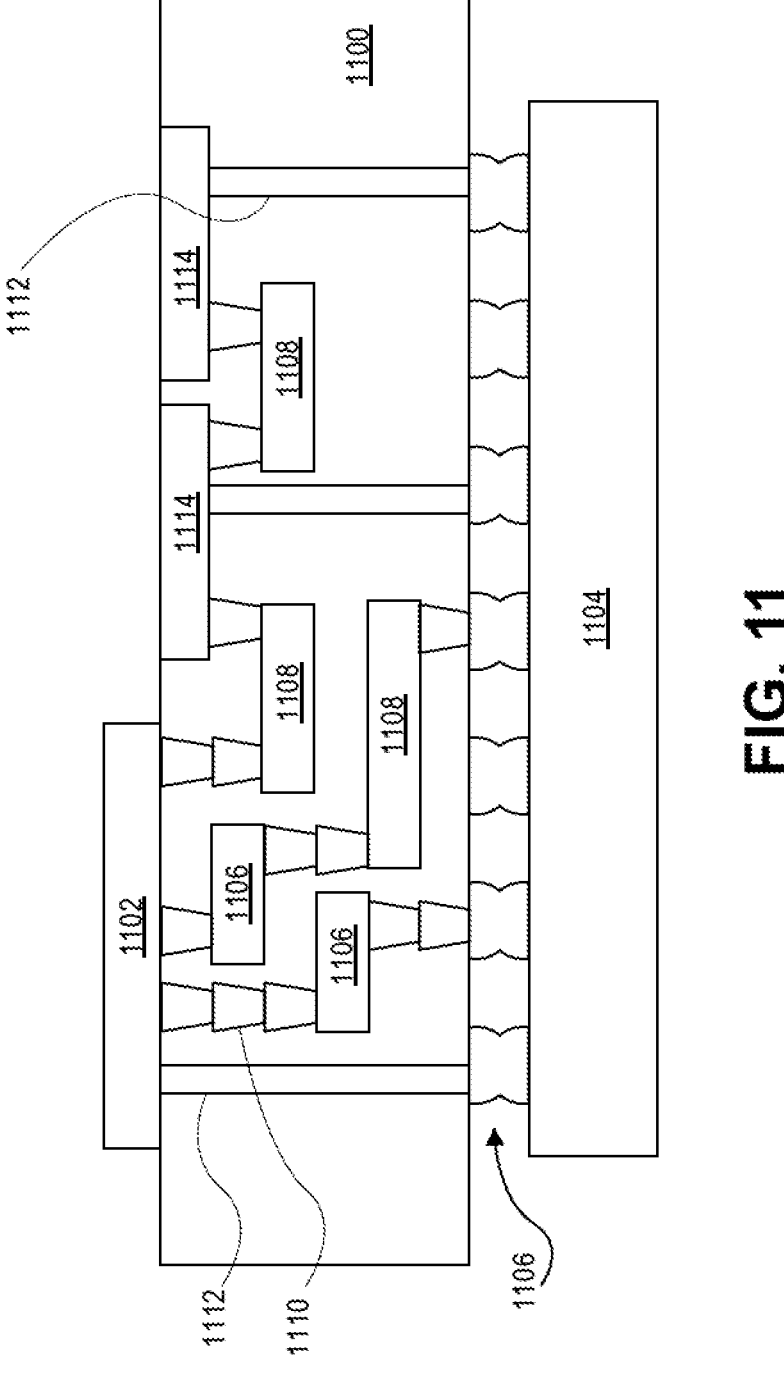
FIG. 11 illustrates an interposer that includes one or more embodiments of the invention.

FIG. 11 illustrates an interposer 1100 that includes one or more embodiments of the invention. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100.

In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer 1100 may be formed of alternate rigid or flexible materials that may include the same materials described above for use in a semiconductor substrate, such as silicon, germanium, and other group III-V and group IV materials.

The interposer 1100 may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the invention, apparatuses or processes disclosed herein may be used in the fabrication of interposer 1100.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is an apparatus comprising: a layer of silicon; a layer of transistors on a side of the layer of silicon; a wall of metal extending through the layer of transistors and into the layer of silicon, the wall of metal surrounding a region of the layer of transistors; an interlayer dielectric (ILD) layer on top of the layer of transistors, the ILD layer surrounded by a metal ring that is physically coupled with the wall of metal; a passivation layer on the ILD layer; and wherein the layer of silicon, the wall of metal, the metal ring, and the passivation layer form a hermetic seal around the region of the layer of transistors.

Example 2 includes the apparatus of example 1, or of any other example or embodiment herein, wherein the wall of metal comprises a metal placed within a through silicon via (TSV) trench that surrounds the region of the layer of transistors.

Example 3 includes the apparatus of example 2, or of any other example or embodiment herein, wherein the TSV trench is a nano TSV trench.

Example 4 includes the apparatus of example 1, or of any other example or embodiment herein, wherein the wall of metal is a first wall of metal, and wherein the metal ring is a first metal ring; and further comprising: a second wall of metal parallel to the first wall of metal, the second wall of metal extending through the layer of transistors and into the layer of silicon, the second wall of metal surrounding a region of the layer of transistors; a second metal ring surrounding the ILD layer that is physically coupled with the second wall of metal; and wherein the layer of silicon the first wall of metal, the first metal ring, the second wall of metal, the second metal ring, and a passivation layer form a hermetic seal around the region of the layer of transistors.

Example 5 includes the apparatus of example 1, or of any other example or embodiment herein, wherein the ILD layer is a plurality of ILD layers; and wherein the passivation layer is on the topmost ILD layer.

Example 6 includes the apparatus of example 1, or of any other example or embodiment herein, wherein the region of the layer of transistors is proximate to an edge of a die.

Example 7 includes the apparatus of example 1, or of any other example or embodiment herein, wherein the metal ring includes a plurality of TSVs filled with a metal material.

Example 8 includes the apparatus of example 1, or of any other example or embodiment herein, wherein the metal ring and the wall of metal are substantially rectangular.

Example 9 includes the apparatus of example 1, or of any other example or embodiment herein, wherein the wall of metal extends through the layer of silicon, wherein the passivation layer is a first passivation layer, and wherein the side of the layer of silicon is a first side of the layer of silicon; and further comprising: a second side of the layer of silicon opposite the first side of the layers silicon; a second ILD layer coupled with the second side of the layer of silicon, the second ILD layer surrounded by a second metal ring that is physically coupled with the wall of metal; a second passivation layer on the second ILD layer; and wherein the layer of silicon, the wall of metal, the second metal ring, and the second passivation layer form a hermetic seal.

Example 10 includes the apparatus example 9, or of any other example or embodiment herein, wherein the second ILD layer is a plurality of second ILD layers; and wherein the second passivation layer is on the topmost second ILD layer.

Example 11 includes the apparatus of example 9, or of any other example or embodiment herein, wherein the second metal ring includes a plurality of TSVs filled with a metal material.

Example 12 includes the apparatus of example 9, or of any other example or embodiment herein, wherein the metal wall, the first metal ring, and the second metal ring overlap each other in a direction that is perpendicular to a plane of the first side of the layer of silicon.

Example 13 includes the apparatus of example 1, or of any other example or embodiment herein, wherein the wall of metal and the metal ring include a selected one or more of: copper, tungsten, cobalt, ruthenium, and/or aluminum.

Example 14 includes the apparatus of example 1, or of any other example or embodiment herein, wherein the layer of transistors include a selected one or more of: 2D transistors or 3D transistors.

Example 15 includes the apparatus of example 1, or of any other example or embodiment herein, wherein the ILD includes a selected one or more of: silicon, carbon, nitrogen, oxygen, $SiO_2$, SiCN, and/or SiN.

Example 16 is a method comprising: providing a silicon substrate; forming a layer of transistors on a side of the silicon substrate; forming a metal wall extending through the layers of transistors and into the silicon substrate, the metal wall surrounding a region of the layer of transistors; forming an interlayer dielectric (ILD) layer on top of the layer of transistors, the ILD layer surrounded by a metal ring physically coupled with the wall of metal; applying a passivation layer on the ILD layer, wherein the silicon substrate, the metal wall, the metal ring, and passivation layer form a hermetic seal around the region of the layer of transistors.

Example 17 includes the method of example 16, or of any other example or embodiment herein, wherein forming a metal wall further includes: forming a through silicon via (TSV) trench surrounding the region of the layer of transistors; and placing a metal in the forms trench, the metal surrounding the region of the layer of transistors.

Example 18 includes the method of example 17, or of any other example or embodiment herein, wherein the TSV trench is a nano TSV trench.

Example 19 includes the method of example 16, or of any other example or embodiment herein, wherein the ILD layer is a plurality of ILD layers and the metal ring is a plurality of metal rings physically coupled with each other; and wherein applying the passivation layer on the ILD layer further includes applying the passivation layer on the top ILD layer.

Example 20 includes the method of example 16, or of any other example or embodiment herein, wherein the metal ring includes a plurality of TSVs filled with a metal.

Example 21 includes the method of example 16, or of any other example or embodiment herein, wherein the metal wall or the metal ring include a selected one or more of: copper, tungsten, cobalt, ruthenium, and/or aluminum.

Example 22 is a package comprising: a die comprising: a layer of hermetic material; a layer of transistors on a side of the layer of hermetic material, wherein the layer of transistors include metal-on-both-sides transistors; a wall of metal extending through the layer of transistors and into the layer of hermetic material, the wall of metal surrounding the layer of transistors; an interlayer dielectric (ILD) layer on top of the layer of transistors, the ILD layer surrounded by a metal ring that is physically coupled with the wall of metal; a passivation layer on the ILD layer; and wherein the layer of hermetic material, the wall of metal, the metal ring, and the passivation layer form a hermetic seal around the layer of transistors; and a substrate electrically coupled with the die.

Example 23 includes the package of example 22, or of any other example or embodiment herein, wherein the wall of metal surrounding the layer of transistors is proximate to an edge of the die.

Example 24 includes the package of example 22, or of any other example or embodiment herein, wherein the wall of metal comprises a metal placed within a nano through silicon via (TSV) trench that surrounds the layer of transistors.

Example 25 includes the package of example 22, or of any other example or embodiment herein, wherein the metal ring includes a plurality of TSVs filled with a metal material.

What is claimed is:
1. An apparatus comprising:
a layer of silicon;
a layer of transistors on a side of the layer of silicon;
a first wall of metal extending through the layer of transistors and entirely through the layer of silicon, the first wall of metal surrounding a region of the layer of transistors;

an interlayer dielectric (ILD) layer on top of the layer of transistors, the ILD layer surrounded by a first metal ring that is physically coupled with the first wall of metal;

a passivation layer on the ILD layer;

wherein the layer of silicon, the first wall of metal, the first metal ring, and the passivation layer form a hermetic seal around the region of the layer of transistors;

a second wall of metal parallel to the first wall of metal, the second wall of metal extending through the layer of transistors and into the layer of silicon, the second wall of metal surrounding a region of the layer of transistors;

a second metal ring surrounding the ILD layer that is physically coupled with the second wall of metal; and wherein the layer of silicon, the first wall of metal, the first metal ring, the second wall of metal, the second metal ring, and a passivation layer form a hermetic seal around the region of the layer of transistors.

2. The apparatus of claim 1, wherein the first wall of metal comprises a metal placed within a through silicon via (TSV) trench that surrounds the region of the layer of transistors.

3. The apparatus of claim 2, wherein the TSV trench is a nano TSV trench.

4. The apparatus of claim 1, wherein the ILD layer is a plurality of ILD layers; and wherein the passivation layer is on the topmost ILD layer.

5. The apparatus of claim 1, wherein the region of the layer of transistors is proximate to an edge of a die.

6. The apparatus of claim 1, wherein the first metal ring includes a plurality of TSVs filled with a metal material.

7. The apparatus of claim 1, wherein the first metal ring and the first wall of metal are substantially rectangular.

8. An apparatus comprising:

a layer of silicon;

a layer of transistors on a side of the layer of silicon;

a wall of metal extending through the layer of transistors and entirely through the layer of silicon, the wall of metal surrounding a region of the layer of transistors;

an interlayer dielectric (ILD) layer on top of the layer of transistors, the ILD layer surrounded by a metal ring that is physically coupled with the wall of metal;

a passivation layer on the ILD layer; and wherein the layer of silicon, the wall of metal, the metal ring, and the passivation layer form a hermetic seal around the region of the layer of transistors, wherein the wall of metal extends through the layer of silicon, wherein the passivation layer is a first passivation layer, and wherein the side of the layer of silicon is a first side of the layer of silicon; and further comprising:

a second side of the layer of silicon opposite the first side of the layers silicon;

a second ILD layer coupled with the second side of the layer of silicon, the second ILD layer surrounded by a second metal ring that is physically coupled with the wall of metal;

a second passivation layer on the second ILD layer; and wherein the layer of silicon, the wall of metal, the second metal ring, and the second passivation layer form a hermetic seal.

9. The apparatus of claim 8, wherein the second ILD layer is a plurality of second ILD layers; and wherein the second passivation layer is on the topmost second ILD layer.

10. The apparatus of claim 8, wherein the second metal ring includes a plurality of TSVs filled with a metal material.

11. The apparatus of claim 8, wherein the metal wall, the first metal ring, and the second metal ring overlap each other in a direction that is perpendicular to a plane of the first side of the layer of silicon.

12. The apparatus of claim 1, wherein the first wall of metal and the first metal ring include a selected one or more of: copper, tungsten, cobalt, ruthenium, and/or aluminum.

13. The apparatus of claim 1, wherein the layer of transistors include a selected one or more of: 2D transistors or 3D transistors.

14. The apparatus of claim 1, wherein the ILD includes a selected one or more of: silicon, carbon, nitrogen, oxygen, $SiO_2$, SiCN, and/or SiN.

15. A method comprising:

providing a silicon substrate;

forming a layer of transistors on a side of the silicon substrate;

forming a first metal wall extending through the layers of transistors and entirely through the silicon substrate, the first metal wall surrounding a region of the layer of transistors;

forming an interlayer dielectric (ILD) layer on top of the layer of transistors, the ILD layer surrounded by a first metal ring physically coupled with the first wall of metal;

applying a passivation layer on the ILD layer;

forming a second wall of metal parallel to the first wall of metal, the second wall of metal extending through the layer of transistors and into the layer of silicon, the second wall of metal surrounding a region of the layer of transistors;

forming a second metal ring surrounding the ILD layer that is physically coupled with the second wall of metal; and wherein the layer of silicon the first wall of metal, the first metal ring, the second wall of metal, the second metal ring, and the passivation layer form a hermetic seal around the region of the layer of transistors.

16. The method of claim 15, wherein forming a metal wall further includes:

forming a through silicon via (TSV) trench surrounding the region of the layer of transistors; and placing a metal in the TSV trench, the metal surrounding the region of the layer of transistors.

17. The method of claim 16, wherein the TSV trench is a nano TSV trench.

18. The method of claim 15, wherein the first metal ring includes a plurality of TSVs filled with a metal.

19. The method of claim 15, wherein the first metal wall or the first metal ring include a selected one or more of: copper, tungsten, cobalt, ruthenium, and/or aluminum.

\* \* \* \* \*